United States Patent [19]

Kameyama

[11] Patent Number: 4,655,162
[45] Date of Patent: Apr. 7, 1987

[54] SEMICONDUCTOR DEVICE MANUFACTURING APPARATUS

[75] Inventor: Masaomi Kameyama, Tokyo, Japan
[73] Assignee: Nippon Kogaku K. K., Tokyo, Japan
[21] Appl. No.: 707,449
[22] Filed: Mar. 1, 1985
[30] Foreign Application Priority Data
  Mar. 12, 1984 [JP] Japan ................... 59-46868
[51] Int. Cl.$^4$ .......... B05C 3/18; B05C 13/02
[52] U.S. Cl. ....................... 118/50; 118/53; 118/54; 118/416; 118/612
[58] Field of Search ............ 118/54, 416, 50, 612, 118/401, 53; 134/140, 149, 157

[56] References Cited

U.S. PATENT DOCUMENTS

| | | | |
|---|---|---|---|
| 1,550,685 | 8/1925 | Eynon et al. | 118/612 X |
| 1,911,124 | 5/1933 | Linder et al. | 118/416 X |
| 2,169,805 | 8/1939 | Kronquest | 118/416 |
| 3,755,011 | 8/1973 | Kleinknecht et al. | 118/401 X |
| 3,903,841 | 9/1975 | Peters | 118/50 |
| 4,006,707 | 2/1977 | Denslow | 118/612 |

Primary Examiner—John P. McIntosh
Attorney, Agent, or Firm—Shapiro and Shapiro

[57] ABSTRACT

The present invention provides a semiconductor device manufacturing apparatus which, in processing wafers with processing liquid, prevents dust contamination of a wafer surface to be processed, enables fine control of processing liquid temperature, enables the wafer surface to be processed uniformly, permits use of only a small amount of processing liquid, and can be adapted for mixed solvents. The apparatus according to the present invention comprises a cup containing the processing liquid, vacuum chuck means holding the wafer by suction on the upper surface of the wafer, and means by which the wafer surface is brought into dynamic contact with the processing liquid.

3 Claims, 12 Drawing Figures

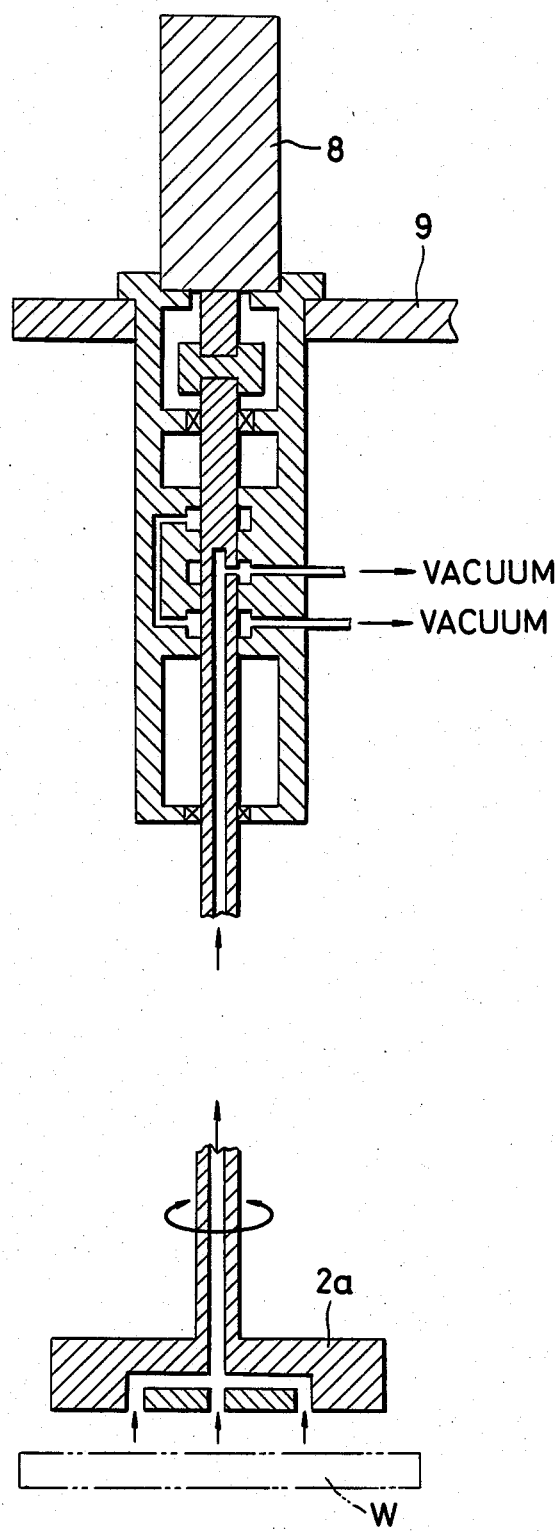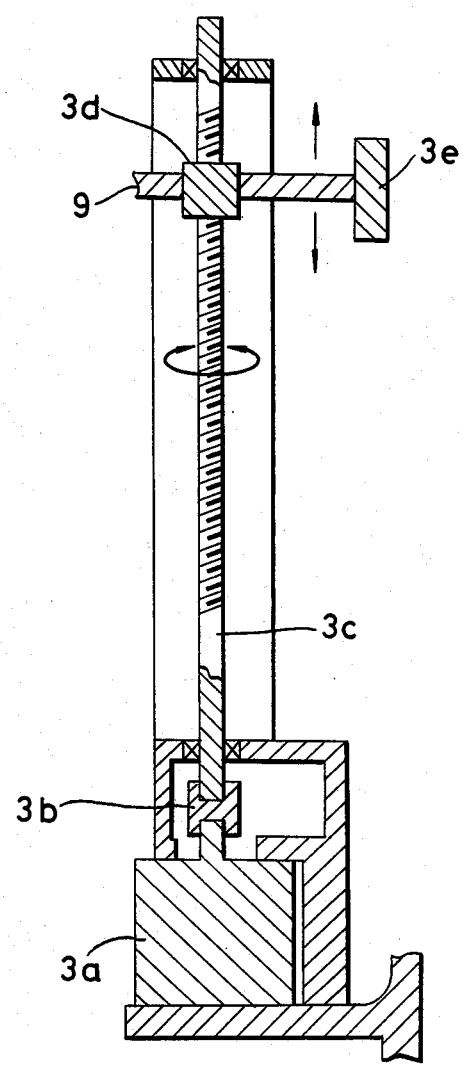

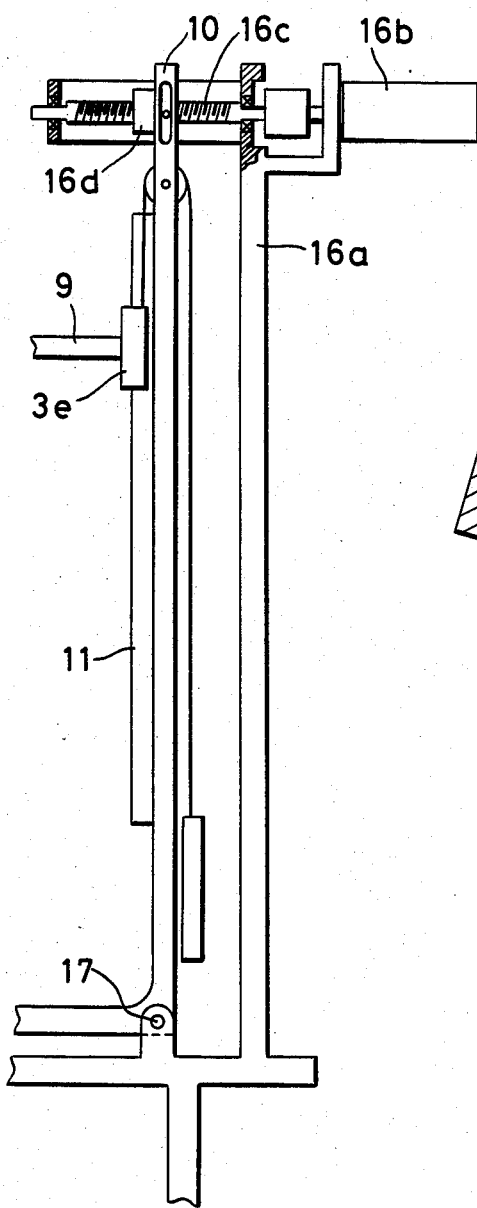
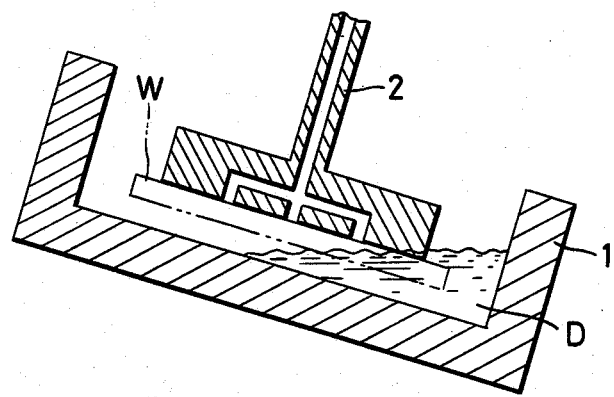
FIG.10
FIG.11

SEMICONDUCTOR DEVICE MANUFACTURING APPARATUS

BACKGROUND OF THE INVENTION

1. Field of the Invention

The present invention relates to a semiconductor device manufacturing apparatus, and more particularly to such apparatus for processing a wafer with processing liquid such as developer.

2. Description of the Prior Art

The conventional wafer processing apparatus are generally classified into:

(1) a spray system in which processing liquid is sprayed from above onto a wafer supported on a spinner chuck;

(2) a dip system in which a carrier containing 1 to 25 wafers is dipped in a dip bath containing the processing liquid; and (3) a paddle system in which a small amount of processing liquid is dropped onto a wafer supported on a spinner chuck to process said wafer, and is then removed by the centrifugal force by rotation of the spinner chuck.

However the spray system (1) is associated with the drawbacks of being susceptible to dust contamination because the wafer is placed upwards; instability in processing because of difficult precise temperature control of the processing liquid; unevenness in processing due to uneven liquid spraying; unsuitability for electron beam photoresists since the composition of processing liquid composed of mixed solvents used for such electron beam photoresists may vary in spraying due to the difference in the vapor pressure of one of said mixed solvents; unevenness in processing, which proceeds faster in the peripheral area of the wafer; and pinhole formation in the photoresist caused by the remaining mist of the sprayed processing liquid which is concentrated in the drying step after processing and drops onto the photoresist.

On the other hand, the dip system (2) is associated with the drawbacks of requiring a large amount of the processing liquid; unstable and uneven processing of the process among the wafers of a lot and between different wafer lots; cumbersome drying of the processed wafers which cannot be easily automated; and difficulty of processing with mixed solvents.

Also the paddle system (3) is associated with the drawbacks of being susceptible to dust contamination because the wafer is placed upwards; difficulty in precise temperature control of the processing liquid; unevenness in processing, which proceeds faster in the peripheral area of the wafer; and unsuitability for processing with mixed solvents.

SUMMARY OF THE INVENTION

A first object of the present invention is to provide a semiconductor device manufacturing apparatus capable of processing a wafer while the processed face thereof is positioned downwards.

A second object of the present invention is to provide such an apparatus only requiring a small amount of the processing liquid and allowing therefore easy temperature control thereof.

A third object of the present invention is to provide such an apparatus in which the processing liquid is brought into contact with the processed face of a wafer, whereby only a small amount of the processing liquid is required and the drying after processing is facilitated.

A fourth object of the present invention is to provide such an apparatus in which the processing liquid is brought into contact with the wafer without spraying, so that the evaporation of the processing liquid may be limited. Therefore, when mixed solvents are used for the processing liquid, the composition of it remains approximately constant during processing. Furthermore, mist in the environment, which might be adsorbed or retrapped onto the photoresist on the wafer after the processing, is not formed during the processing.

A fifth object of the present invention is to provide such an apparatus ensuring uniform processing over the entire processed face of the wafer.

A sixth object of the present invention is to provide such an apparatus ensuring uniform processing among different wafers.

The foregoing objects can be achieved according to the present invention by a semiconductor device manufacturing apparatus comprising a cup for containing processing liquid; vacuum chuck means positioned above said cup and adapted for applying suction to an upper face which is a non-processed face of the wafer; and displacing means for relative approaching or distancing of said cup and said vacuum chuck means.

The cup constituting a part of the apparatus of the present invention is a container for the processing liquid and can be composed of any container having an upper aperture allowing passage of the wafer. Consequently it can be composed of a cup already known in other technical fields.

The vacuum chuck means itself is already known in the prior art and is easily commercially available. It is used for fixing, by suction, the upper face, or unprocessed face, of the wafer.

The displacing means itself is already known, and is easily available commercially.

The apparatus of the present invention provides the advantages of not being susceptible to dust contamination, since the processed face of the wafer is positioned downwards; allowing precise temperature control of the processing liquid, with a precision of $\pm 0.1°$ C., since only a small amount of the processing liquid is required; uniform and stable processing with satisfactory reproducibility; adaptability to submicron pattern formation on the wafer; adaptability to wafers of a larger diameter; and absence of necessity for maintenance of the processing liquid, in contrast to a conventional apparatus in which a large amount of the processing liquid is repeatedly used, since a small amount of the processing liquid is often replaced with new processing liquid.

BRIEF DESCRIPTION OF THE DRAWINGS

FIG. 2 is a partial enlarged view of the apparatus shown in FIG. 1;

FIG. 3 is another partial enlarged view of the apparatus shown in FIG. 1;

FIG. 10 is a schematic side view of inclining means in a seventh embodiment; and FIG. 11 is a schematic vertical cross-sectional view of a part of a cup and chuck means in the seventh embodiment.

DETAILED DESCRIPTION OF THE PREFERRED EMBODIMENTS

Now the present invention will be clarified in greater detail by embodiments thereof shown in the attached drawings. It is to be understood, however, that the present invention is by no means limited by these embodiments.

1st embodiment

Figure 1:
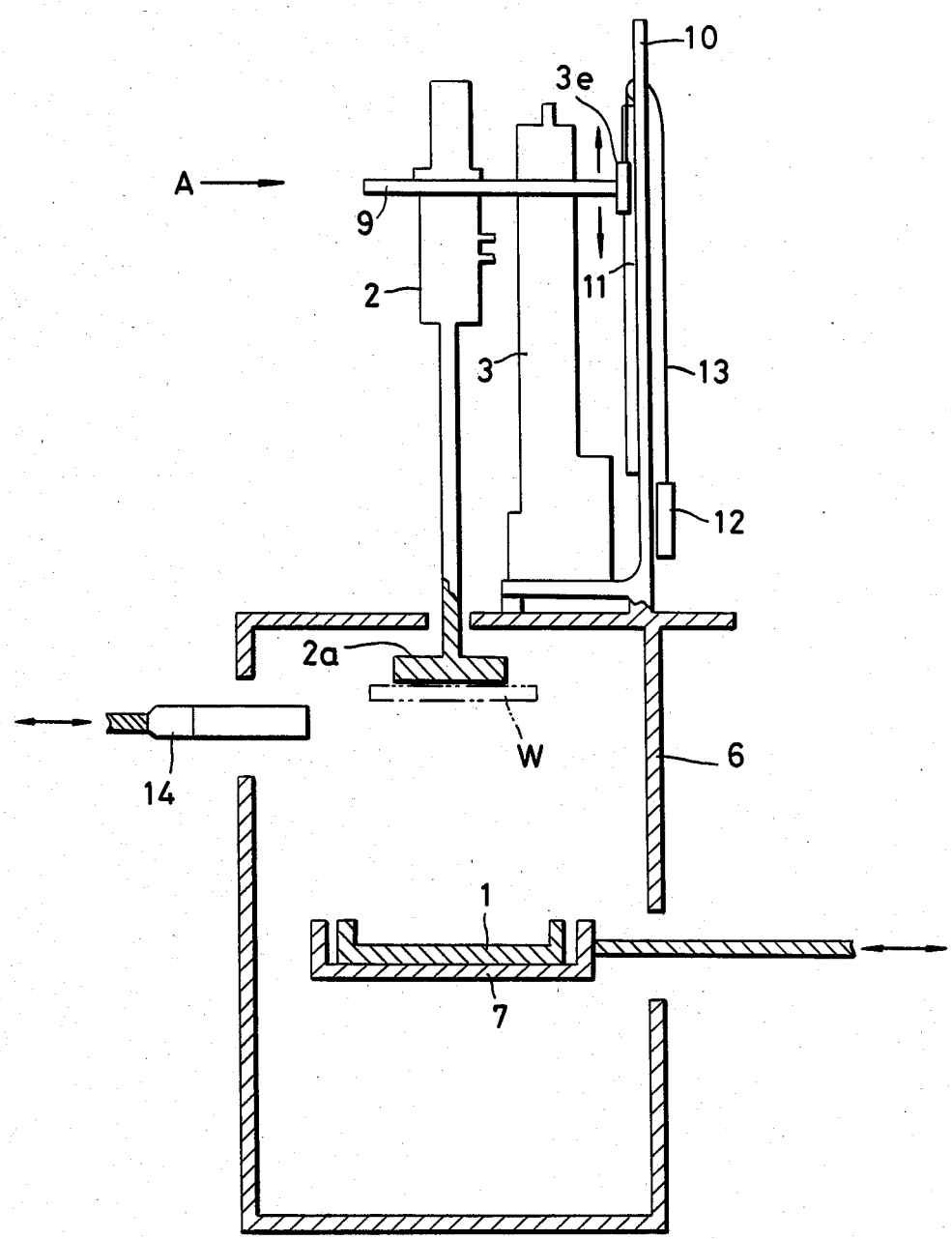
FIG. 1 is a schematic vertical cross-sectional view of a first embodiment of the semiconductor device manufacturing apparatus of the present invention.

As shown in FIG. 1, the apparatus of the present invention is essentially composed of a cup 1 for containing processing liquid; a vacuum chuck device 2 for applying suction to the upper face, or unprocessed face of a wafer W; and a displacing means 3 for approaching or separating said chuck means 2 to or from said cup 1. The cup 1 and a suction unit 2a of the chuck device 2 are positioned inside a processing chamber which is separated from the exterior by a housing 6.

The cup 1 is placed on a cup support member 7 and installed into or removed from the processing chamber by means of moving means (not shown). The replacement of the processing liquid is made when said cup is removed from the processing chamber.

The cup 1 contains processing liquid, such as developer, etchant or rinse with a depth of 0.5 to 25 mm, preferably 0.5 to 10 mm, particularly 0.5 to 5 mm.

One of the favourable features of the present invention is the use of a small amount of the processing liquid in the cup, the processing liquid being replaced after processing a limited number of wafers. The use of a small amount of the processing liquid facilitates the temperature control thereof, and the frequent replacement thereof ensures constant result of processing.

The processing liquid may be placed in advance in the cup and is brought into contact with the lower processed face of the wafer by lowering said wafer, or the processing liquid may be poured into the cup after the face of the wafer to be processed is lowered to a position close to the bottom of the cup. In the latter case the processed face of the wafer may be positioned close enough to the cup bottom for causing a capillary phenomenon therebetween, and the processing liquid may be supplied into the gap between said face and said bottom by means of the capillary phenomenon. The liquid supply by capillary phenomenon is preferable for avoiding bubble adhesion onto the processed face of the wafer.

As shown in FIG. 2, the vacuum chuck device 2 is composed of a suction unit 2a and an evacuating device (designated by the legend "VACUUM") for eliminating air in the suction unit 2a, whereby the air is discharged as indicated by arrows. The wafer W is sucked to the suction unit 2a by the force of said suction. Above said suction unit 2a there is provided rotary means 8 which rotates the wafer W sucked to the suction unit 2a about a rotary axis perpendicular to the processed face of the wafer W. The speed of rotation is for example 50 rpm at maximum in the development step, and 1,000 rpm at maximum in the rinse step. The rotary means 8 may be provided with first control means (not shown) for causing intermittent rotary motion, or with second control means (not shown) for causing alternating rotary motion. The vacuum chuck device 2 and the rotary means 8, excluding the evacuating device, are mounted on a support 9 through which they are linked with the displacing means 3.

FIG. 3 shows the internal structure of the displacing means 3 for vertically displacing the vacuum chuck device 2. Said displacing means 3 comprises a DC motor 3a; a feed screw 3c linked with the rotary shaft of said motor through a coupler 3b; a nut 3d mounted on said feed screw; and a movable member 3e supporting said nut in fixed rotational position. When the feed screw 3c is rotated by the motor 3a, the nut 3d moves upwards or downwards since it is supported in fixed rotational position by the movable member 3e. Said movable member 3e is provided with a dovetail flute which engages with a dovetail formed on a guide member 10 fixed to a pillar 11 (FIG. 1). Consequently the movable member 3e is movable in the vertical direction but not in the horizontal direction.

The movable member 3e is connected with a balance weight 12 through a wire 13 in such a manner that all the weight on said movable member 3e is balanced with said balance weight 12. The nut 3d is also fixed to the support member 9 which supports the vacuum chuck device 2 and the rotary means 8, whereby the support 9 moves vertically together with said vacuum chuck device 2 and the rotary means 8, following the vertical movmement of the nut 3d. The vertical movement of said support 9 requires little force because of the presence of the balance weight 12.

Figure 4:
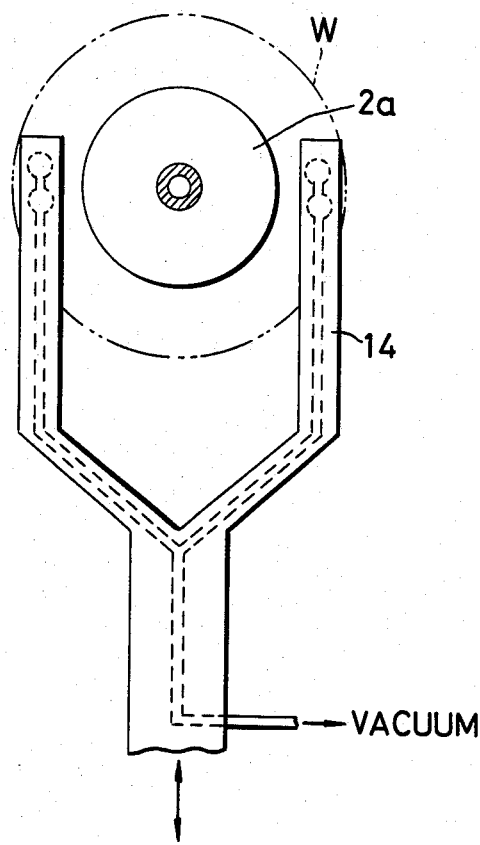
FIG. 4 is an enlarged plan view of a wafer exchanging device (13) shown in FIG. 1.

The rotation of the motor 3a displaces the wafer over a maximum stroke of 180 mm. After the wafer is stopped at a position slightly below the highest position, a wafer exchanger 14 shown in FIG. 4 is extended into the housing 6 and supports the upper face of the wafer by suction, at positions outside the suction unit 2a of the vacuum chuck 2. Then the suction unit 2a of the vacuum chuck device 2 terminates the air suction and starts air discharge, whereby the wafer is disengaged from the vacuum chuck device 2 and is supported by the wafer exchanger 14. Subsequently the vacuum chuck device 2 is lifted upwards, and the wafer exchanger 14 supporting the wafer is retracted from the housing 6. After replacement with a new wafer, the wafer exchanger supporting a new wafer is again extended into the housing 6. Subsequently the vacuum chuck device 2 is lowered and supports the wafer by suction, whereupon the wafer exchanger 14 disengages the wafer and returns to the original position.

The vacuum chuck device 2 supporting the new wafer starts descent by the reverse rotation of the motor 3a and stops when the lower face of the wafer is brought into contact with the processed liquid placed in the cup 1. Then the rotary means 8 starts rotation while maintaining the mutual contact between the wafer and the processing liquid. The vacuum chuck device 2 may be slightly vibrated vertically in combination with or in place of the rotation by the rotary means 8. Said slight vibration can be obtained by alternating the rotation of the motor 3a for example with a frequency of 3 Hz. Consequently said motor 3a functions also as vibrating means. Said vibration is not limited to the frequency of 3 Hz but may be slower or faster, for example ultrasonic vibration. The amplitude of said vibration is for example 1 mm at maximum for the development step, and 10 mm at maximum at the rinse step. Said vibration homogenizes the processing liquid by agitation, thus achieving a shorter processing time, an even processing over the entire wafer, and a reproducible result of process between different wafers.

Said vibration is not limited to the vertical vibration but may be a horizontal vibration caused by the vacuum chuck device 2.

2nd embodiment

In the following there will be explained an apparatus comprising further second rotary means for causing a planetary movement of the wafer in addition to the rotary motion thereof.

Figure 5:
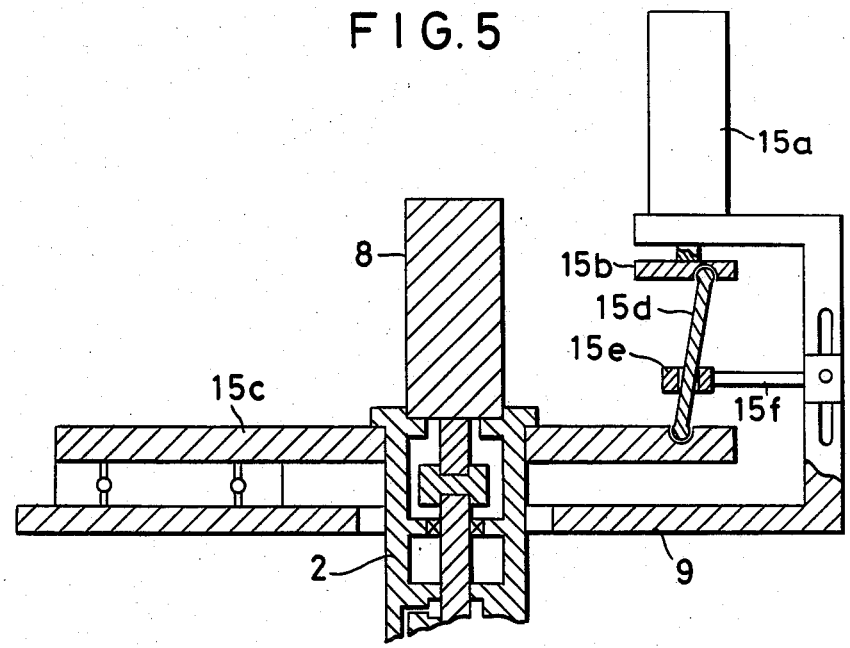
FIG. 5 is a schematic vertical cross-sectional view of second rotary means for planetary movement of a wafer in a second embodiment.

As shown in FIG. 5, the second rotary means comprises a DC motor 15a; a rotary member 15b fixed at the end of the rotary shaft of said motor; a stage 15c capable of moving in two mutually orthogonal horizontal direcctions; and a lever 15d for connecting the rotary member 15b with an end of said stage 15c. Said lever 15d transmits the circular movement of the rotary member 15b to the stage 15c. The lever 15d has an intermediate fulcrum 15e which is supported by a support lever 15f. Said support lever 15f is vertically movable so that the position of said fulcrum 15e is likewise movable vertically. Thus the radius and period of rotation of the stage 15c can be regulated by a change in the position of said fulcrum 15e.

The vacuum chuck device 2 and the rotary means 8 are fixed at the approximate center of said stage 15c, whereby the wafer supported by said chuck device 2 performs a planetary movement by said second rotary means 15a-15f, in combination with the rotation by said rotary means 8. The radius of said planetary rotation is for example 5 mm at maximum, and the period of said rotation is for example 60 rpm.

3rd embodiment

The apparatus of the present embodiment is the same as that in the 1st embodiment, except that the cup itself has a hollow structure for temperature control of the processing liquid.

Figure 6A:
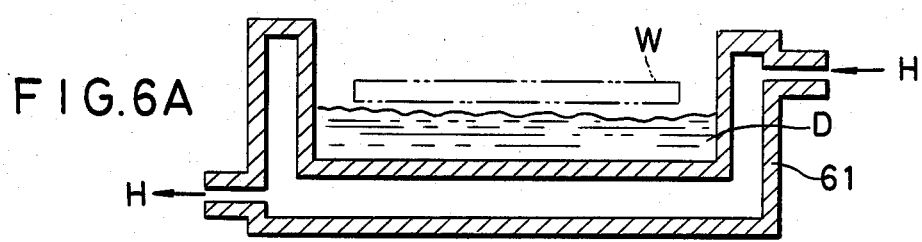
FIGS. 6A and 6B are vertical cross-sectional views of a cup in a third embodiment.

The cup temperature should be controlled for controlling the temperature of the processing liquid, and the body of the cup 61 is formed hollow as shown in FIG. 6A in which a heating medium H such as water is circulated. Said heating medium H is circulated with an external temperature control system (not shown), whereby the temperature of the heating medium can be controlled with a precision of ±0.1° C.

Figure 6B:
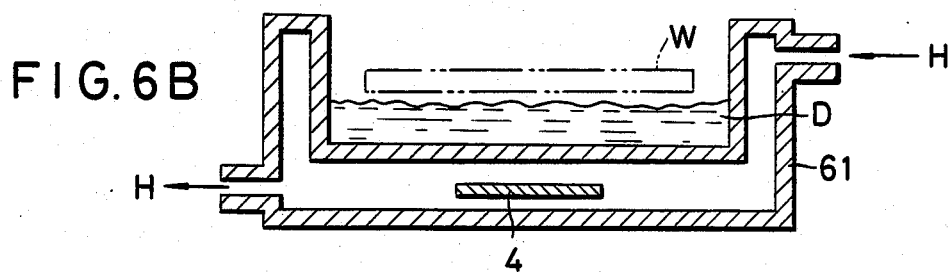

It is also possible to provide an ultrasonic vibrator 4 in the hollow part of the cup 61 as shown in FIG. 6B to cause vibration in the heating medium, there indirectly vibrating or stirring the processing liquid.

4th embodiment

The apparatus of the present embodiment is the same as that in the 1st embodiment except that an ultrasonic vibrator or a magnetic stirrer is provided in the cup.

Figure 7:
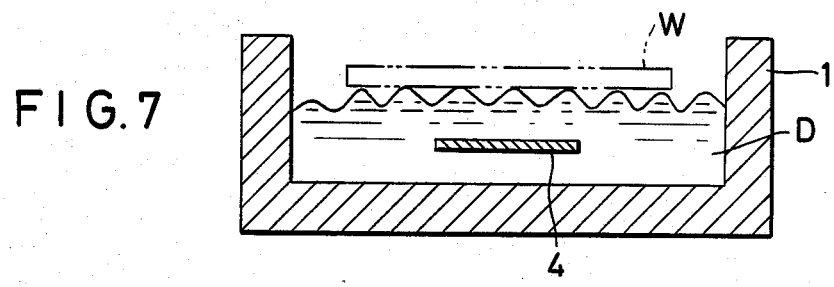
FIG. 7 is a vertical cross-sectional view of a cup in a fourth embodiment.

The agitation of the processing liquid is preferable in order to achieve uniform temperature and concentration of the processing liquid. For this purpose, as shown in FIG. 7, stirring means such as an ultrasonic vibrator 4 or a magnetic stirrer is positioned in the processing liquid D. In the latter case, however, a rotating element alone is placed in the processing liquid, and the main body of the magnetic stirrer is embedded in or placed under the bottom of the cup 1. In case of employing an ultrasonic vibrator, the wafer W may be maintained at the surface of the processing liquid or may be positioned above said surface with a height not exceeding 3 mm. Even when the wafer is maintained above the liquid surface, the processing liquid is brought into contact with the wafer W since waves are generated on the liquid surface by the ultrasonic vibration. In this manner the required amount of the processing liquid can be further reduced.

Under certain conditions, the wafer may be detached from the vacuum chuck device 2 during the processing and float on the surface of the vibrating liquid.

5th embodiment

The apparatus of the present embodiment is the same as that of the 1st embodiment except that the cup is provided with a blow-off device for blowing inert gas such as nitrogen gas into the processing liquid for agitation thereof.

Figure 8:
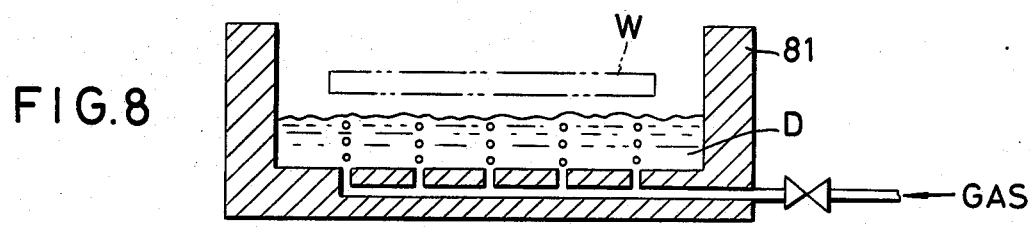
FIG. 8 is a vertical cross-sectional view of a cup in a fifth embodiment.

As shown in FIG. 8, the cup 81 is provided, in the bottom thereof, with a gas supply pipe, which communicates with plural apertures formed in said bottom. A gas that is chemically compatible with the processing liquid is blown into the processing liquid through said supply pipe, thus satisfactorily agitating the processing liquid.

6th embodiment

The apparatus of the present embodiment is the same as that of the 1st embodiment except that the cup is provided with an external circulating system for circulating the processing liquid in the cup to the exterior for agitation and purification of the processing liquid.

Figure 9:
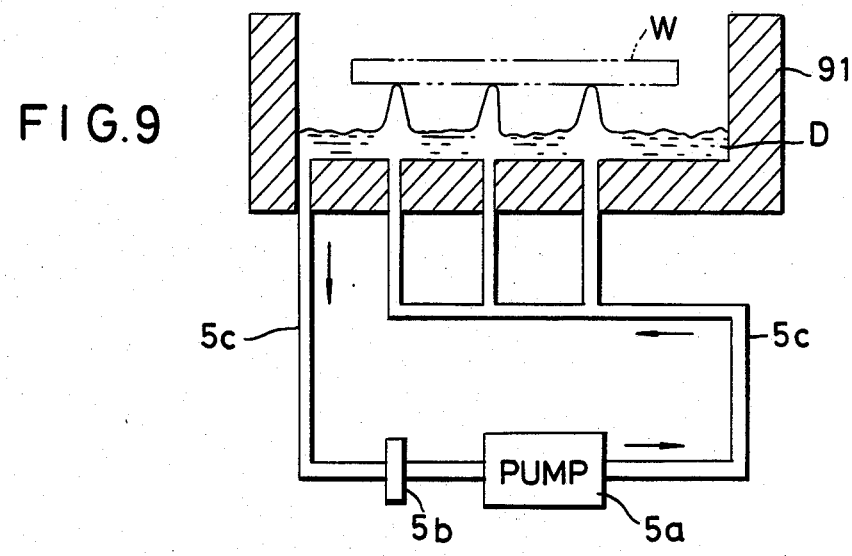
FIG. 9 is a schematic vertical cross-sectional view of a cup in a sixth embodiment.

As shown in FIG. 9, the cup 91 is provided, at the bottom thereof, with a liquid outlet and plural liquid inlets. The external circulating system is composed of a pump 5a for circulating the processing liquid, a filter 5b for purifying the processing liquid and a circulating pipe 5c. If the processing liquid is strongly emitted from the inlets, it can reach the wafer even when said wafer is separated from the liquid surface, so that the required amount of the processing liquid can be reduced.

The external circulating system may be further provided with a temperature control system for controlling the temperature of the processing liquid.

During the processing of the wafer, the processing liquid may generate bubbles, which, if attached to the wafer, hinders uniform processing. In order to avoid such bubble adhesion, the interior of the housing 6 may be maintained at vacuum or at a reduced pressure.

On the other hand, for controlling the temperature of the wafer, the vacuum chuck device 2 may be constructed hollow and a heating medium may be circulated therein.

7th embodiment

The apparatus of the present embodiment is the same as that of the 1st embodiment except that inclining means is provided to incline the cup and the vacuum chuck device. As shown in FIG. 10, said inclining means comprises a DC motor 16b mounted on the upper end of a second pillar 16a fixed to the housing 6, a feed screw 16c connected to the shaft of said motor, and a nut 16d engaging with said feed screw. Said nut 16d is fixed to the upper end of the pillar 10, of which the lower end is supported by a fulcrum 17. Thus, when the nut 16d is pulled toward the motor by the rotation thereof, the pillar 10 becomes inclined toward the right about said fulcrum 17. Consequently the vacuum chuck device 2 also becomes inclined toward the right whereby the wafer is also inclined. The inclination of the wafer is 60° at maximum, preferably 30° at maximum.

If the cup 1 is also inclined according to the inclination of the wafer W, the processing liquid D gathers at the lower corner of the cup 1, as shown in FIG. 11. The processing liquid D is not enough for wetting the entire wafer W but only wets a part thereof. However the rotation of the wafer W by the rotary means 8 allows the entire wafer to be wetted by the processing liquid.

On the other hand, if the wafer is maintained close enough to the bottom of the cup 1 and a small amount of the processing liquid is poured into the cup, it enters the gap between the cup bottom and the wafer by the capillary phenomenon. In this case it is possible to wet the entire wafer with the processing liquid even without rotating the wafer by the rotary means 8. The utilization of the capillary phenomenon prevents bubble formation and bubble adhesion to the processed face of the wafer.

In case the processing liquid is aqueous, it is repelled by the non-processed face of the wafer if said face is in advance rendered hydrophobic. Such hydrophobic treatment prevents the waste of the processing liquid on the non-processed face of the wafer and thus economizes the consumption of the processing liquid.

The inclining means of the 7th embodiment is applicable not only to the apparatus of the 1st embodiment but also to any apparatus shown in the 2nd to 6th embodiments.

It is furthermore possible to place the processing liquid in the cup maintained in the horizontal position, then gently lowering the inclined vacuum chuck device 2 to bring the lower end of the wafer into contact with the processing liquid, and bring the vacuum chuck device 2 to the vertical position for gradually contacting the entire wafer with the processing liquid. This method is particularly preferable for preventing bubble adhesion to the wafer.

I claim:

1. A semiconductor device manufacturing apparatus comprising:
   a cup containing processing liquid;
   vacuum chuck means positioned above said cup and adapted for fixing by suction the upper non-processed face of a wafer to be processed; and
   displacing means for displacing at least one of said cup and said chuck means thereby causing relative approaching or distancing of said cup and said chuck means, said displacing means having rotary means for causing said cup or chuck means to effect a planetary motion about an axis perpendicular to the processed face of the wafer.

2. An apparatus according to claim 1, further comprising first control means for intermittently driving said rotary means.

3. An apparatus according to claim 1, further comprising second control means for alternating the direction of rotation of said rotary means.

* * * * *